(12) United States Patent
Bernasconi et al.

(10) Patent No.: US 10,651,376 B2
(45) Date of Patent: May 12, 2020

(54) METHOD OF MANUFACTURING A MEMORY DEVICE

(71) Applicants: COMMISSARIAT A L'ENERGIE ATOMIQUE ET AUX ENERGIES ALTERNATIVES, Paris (FR); STMICROELECTRONICS (CROLLES 2) SAS, Crolles (FR)

(72) Inventors: Sophie Bernasconi, Laval (FR); Christelle Charpin-Nicolle, Fontanil-Cornillon (FR); Aomar Halimaoui, La Terrasse (FR)

(73) Assignees: COMMISSARIAT A L'ENERGIE ATOMIQUE ET AUX ENERGIES ALTERNATIVES, Paris (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/878,036

(22) Filed: Jan. 23, 2018

(65) Prior Publication Data
US 2018/0254414 A1 Sep. 6, 2018

(30) Foreign Application Priority Data
Jan. 25, 2017 (FR) ..................... 17 50594

(51) Int. Cl.
*H01L 45/00* (2006.01)
*H01L 21/02* (2006.01)
*G11C 13/00* (2006.01)

(52) U.S. Cl.
CPC .......... *H01L 45/10* (2013.01); *G11C 13/0007* (2013.01); *G11C 13/0011* (2013.01);
(Continued)

(58) Field of Classification Search
CPC ... H01L 21/02258; H01L 45/08; H01L 45/10; H01L 45/1233; H01L 45/1246;
(Continued)

(56) References Cited

U.S. PATENT DOCUMENTS

| 8,470,681 B2 | 6/2013 | Rossel et al. | |
| 2004/0001374 A1* | 1/2004 | Tanaka | H01L 45/06 365/200 |
| 2004/0180516 A1 | 9/2004 | Watabe et al. | |
| 2005/0019975 A1* | 1/2005 | Lee | H01L 45/06 438/95 |
| 2006/0163553 A1* | 7/2006 | Liang | H01L 45/06 257/3 |
| 2006/0192193 A1* | 8/2006 | Lee | H01L 45/06 257/2 |
| 2010/0117051 A1 | 5/2010 | Tian et al. | |

(Continued)

FOREIGN PATENT DOCUMENTS

WO WO 2016/115601 A1 7/2016

OTHER PUBLICATIONS

French Preliminary Search Report dated Sep. 22, 2017 in French Application 17 50594 filed on Jan. 25, 2017 (with English Translation of Categories of Cited Documents and Written Opinion).
(Continued)

*Primary Examiner* — Stephen W Smoot
(74) *Attorney, Agent, or Firm* — Oblon, McClelland, Maier & Neustadt, L.L.P.

(57) ABSTRACT

The present invention relates to a memory device comprising a first electrode (27), a second electrode (28) and an active portion that can change conductive state, positioned between a first face of the first electrode (27) and a first face of the second electrode (28).
The first electrode (27) comprises an upper portion forming the first face of the first electrode (27). At least one out of the upper portion and the active portion that can change conductive state comprises a porous layer (15).

30 Claims, 6 Drawing Sheets

(52) U.S. Cl.
CPC .... *G11C 13/0069* (2013.01); *H01L 21/02258* (2013.01); *H01L 45/08* (2013.01); *H01L 45/12* (2013.01); *H01L 45/1233* (2013.01); *H01L 45/1246* (2013.01); *H01L 45/1253* (2013.01); *H01L 45/1273* (2013.01); *H01L 45/146* (2013.01); *H01L 45/16* (2013.01); *H01L 45/1641* (2013.01); *G11C 2013/0078* (2013.01); *G11C 2213/32* (2013.01); *G11C 2213/52* (2013.01); *G11C 2213/56* (2013.01)

(58) Field of Classification Search
CPC ............. H01L 45/1253; H01L 45/1273; H01L 45/146; H01L 45/16; H01L 45/1641; G11C 13/0011; G11C 2213/52
See application file for complete search history.

(56) References Cited

U.S. PATENT DOCUMENTS

| | | |
|---|---|---|
| 2013/0075685 A1 | 3/2013 | Li et al. |
| 2013/0214237 A1 | 8/2013 | Tendulkar et al. |
| 2015/0162192 A1 | 6/2015 | Schulze et al. |
| 2015/0162418 A1 | 6/2015 | Meiser et al. |
| 2016/0049296 A1 | 2/2016 | Schulze et al. |
| 2017/0117383 A1 | 4/2017 | Meiser et al. |

OTHER PUBLICATIONS

A. Halimaoui "Porous silicon formation by anodisation," EMIS Data Reviews Series EM/018z, Aug. 1997, pp. 12.

\* cited by examiner

DETAIL A

DETAIL A

DETAIL A

FIG. 19

METHOD OF MANUFACTURING A MEMORY DEVICE

FIELD OF THE INVENTION

The present invention relates to a memory device and more particularly to a non-volatile resistive memory device and its manufacturing method. In particular, OXRAM memories are aimed at.

PRIOR ART

OxRRAM resistive memories (acronym for "Oxide-Based Resistive Random Access Memories") typically comprising a layer of metal oxide, are preferably chosen for non-volatile uses, with the goal of replacing Flash memories. In particular, they have the advantage of being compatible with the end of line method (acronym BEOL for "Back-End Of Line") of the CMOS technology (acronym for "Complementary Metal-Oxide-Semiconductor"). OxRRAM resistive memories are devices comprising in particular a layer of metal oxide deposited between two electrodes. The electric resistance of such devices can be modified by writing and erasing operations. These writing and erasing operations allow the OxRRAM resistive memory device to be switched from a low-resistance state LRS (acronym for "Low Resistive State") to a high-resistance state (acronym for "High Resistive State") and vice versa.

From one cycle to another, the resistances of the low-resistance state LRS and high-resistance state HRS show a variability in performance both from cycle to cycle and cell to cell. This variability is particularly significant for the high-resistance state HRS, leading to a reduction in the programming window, or even a total loss of the programming window. This problem of variability is at present a real obstacle to industrialisation.

This problem remains despite numerous efforts made in the fields of methods for manufacturing resistive-memory devices and programming methods.

One solution approach involves reducing the dimensions of one of the electrodes in order to more precisely localise the memory point, at which an electrical conduction path through the layer of oxide is made, in order to reduce for example the contact surface between the layer of metal oxide and the underlying layer of the first electrode. Another approach, like in the patent publication US2006/0006471 A1, discloses a perturbation element that allows the conductive filament produced in the layer of oxide to be localised in a precise zone in order to make the operation of "forming", an operation by which a conductive path is initiated through the layer of oxide between the first and second electrodes, more reliable. Indeed, the addition of this perturbation element generates a greater stress field and the conducive filament resulting from the operation called "forming" operation has a high chance of being formed in the zone of greater stresses. Nevertheless, the manufacturing of the perturbation element proposed by this prior art poses serious difficulties. The creation of this perturbation element, in particular the control of the proposed shape, is difficult to master, especially if creating small cones or small pyramids is desired.

In general, the current techniques use costly lithography steps and the resolutions obtained for the definition of the memory point are affected by these steps.

There is therefore a need to propose a memory device and a method for manufacturing it that allow the techniques known up to today to be improved.

SUMMARY OF THE INVENTION

According to a first aspect, the invention relates to a method for manufacturing a memory device comprising a first electrode, a second electrode and an active portion that can change of conductive state, positioned between a first face of the first electrode and a first face of the second electrode, the first electrode comprising an upper portion forming the first face of the first electrode.

Advantageously, at least one out of the upper portion and the active portion that can change of conductive state comprises a porous layer.

The porous layer allows a location of preferred electric conduction to be defined. This definition is formed by a differential in electric conductivity between the pores of the layer and the material of the layer. This definition can be carried out by using the material of the porous layer as a zone of electric conduction, in particular in the active portion that can change of conductive state. It can also be carried out by using a material of the porous layer that is more resistive than a material for filling the pores, in particular for a use of the porous layer in an electrode.

Thus, according to one possibility, this device is such that the upper portion comprises a porous layer in contact with the layer of oxide and located on a base portion of the first electrode, at least one pore of the porous layer being at least partially filled with an electrically conductive material configured to establish electric continuity between the base portion of the first electrode and the active portion that can change of conductive state.

Thus, the pore(s) in question create conductive passages having a size that can be very small and in practice defined by the size of the pores. These conductive passages allow the location of creation of a conductive filament through the active portion to be defined. They can be very small without involving costly steps of lithography at high resolution.

According to another alternative or complementary possibility, a porous layer is comprised in the active portion that can change of conductive state and is in contact with at least one out of the first face of the first electrode and the first face of the second electrode. The material of the porous layer is preferably a material that can change of conductive state in order to be the location of this change of state in the active portion.

Thus, the step of forming and then the changes in state can be produced through the material of the porous layer. Here again, the definition of the location through which the current passes is precise.

According to another aspect of preferred embodiments, a method for manufacturing a memory device is presented, comprising:
  the formation of a first electrode;
  the formation of an active portion that can change of conductive state and has a face in contact with a first face of the first electrode;
  the formation of a second electrode in contact with another face of the active layer that can change of conductive state.

Advantageously, such a method is such that a porous layer is formed in at least one out of the active portion and the upper portion of the first electrode.

According to one possibility, the formation of the first electrode comprises the formation of an upper portion forming the first face of the first electrode, comprising:

the formation of a porous layer in contact with the active portion that can change of conductive state and located on a base portion of the first electrode;

the at least partial filling of at least one pore of the porous layer with an electrically conductive material configured to establish electric continuity between the base portion of the first electrode and the active layer that can change of conductive state.

According to another possibility, the formation of an active portion that can change of conductive state comprises the formation of a porous layer in contact with the first electrode.

Another object of the present invention relates to a microelectronic device comprising a plurality of memory devices according to the invention.

Microelectronic device means any type of device made with the means of the microelectronics industry.

These devices include in particular, in addition to the devices with purely electronic uses, micromechanical or electromechanical devices (MEMS, NEMS . . . ) and optical or optoelectronic devices (MOEMS . . . ).

INTRODUCTION OF THE DRAWINGS

Other features, goals and advantages will appear upon reading the detailed description that follows, in comparison to the appended drawings, which are given as examples and are non-limiting and in which.

The drawings are given as examples and are not limiting to the invention. They are schematic representations of a principle intended to facilitate the understanding of the invention and are not necessarily on the scale of the practical applications, in particular with regard to the thickness of the various layers illustrated.

DETAILED DESCRIPTION

Before getting into the details of various embodiments, in particular in reference to the drawings introduced below, various purely optional and non-limiting features that embodiments can have individually or in any combination thereof are listed below:

the electrically conductive material, used in the embodiment in which the pores are filled, completely fills the at least one pore; nevertheless, this is not absolutely necessary since a continuity via incomplete filling (for example only on the lateral wall of the pore) can suffice;

in the preceding case, the porous layer advantageously has an electrical resistivity greater than or equal to that of the electrically conductive material;

the porous layer is a semi-insulating material.

the porous layer is obtained from p- or n-doped silicon. This advantageous arrangement allows an orientation of the pores along the thickness of the porous layer, with the shape of a column, to be promoted. The filling is easier and the electric conduction more direct through the porous layer.

the porous layer is made of silicon dioxide.

The level of electric conductivity of this portion is reduced and contrasts even more with that of the filling material through which the electrical path is established, the silicon dioxide is obtained via oxidation of silicon, preferably p- or n-doped;

the size of the pores is preferably less than 100 nm and in particular less than 50 nm, and advantageously less than 10 nm, and/or greater than or equal to 2 nm;

the material electrically conductive is titanium nitride (TiN), or in particular one of: TaN, WSi, TiAlN;

at least one out of a thickness dimension and a width dimension, perpendicular to the thickness dimension, of the porous layer is less than 100 nm, and preferably less than 50 nm.

The pores of the porous layer, when it is in the active portion, are at least partly under vacuum, or filled with air or filled with a material more electrically insulating than the material of the porous layer and/or dielectric in nature, in particular having a resistivity greater than or equal to $10^4$ $\Omega$cm and preferably greater than or equal to $10^6$ $\Omega$cm.

The active portion that can change phase can thus comprise, between the porous layer and the second electrode, a second layer more electrically insulating than the porous layer.

The second layer is in the latter case optionally made of an oxide of the material of the porous layer.

The method can further comprise one and/or the other of the features such as:

the filling is configured to totally fill at least one pore; this case is not limiting as indicated above;

the filling comprises deposition of the electrically conductive material on the porous layer and then removal of a portion of the electrically conductive material deposited on the surface of the porous layer;

the formation of the porous layer comprises the deposition of a layer of a semiconductor material, and then porosification of the semiconductor material;

the porosification is obtained via electrochemical anodisation by using the base portion of the first electrode as an electrical contact for the anodisation;

the surface of the base portion is used as a barrier layer for the porosification;

the porosification is stopped before it reaches the base portion, in order to preserve a layer of non-porous semiconductor material under the porous layer;

before the deposition of a layer of semiconductor material, an underlying layer of a second semiconductor material different from the first semiconductor material is deposited, the deposition of a layer of a semiconductor material being carried out in contact with the underlying layer, and a variation in electric potential is detected during the electrochemical anodisation corresponding to an end of anodisation of the thickness of the layer of a semiconductor material and to the beginning of anodisation of the underlying layer, and the electrochemical anodisation is stopped upon detection of the variation in potential.

the semiconductor material and the second semiconductor material are silicons having doping that differs by the type of dopant (p, n) or by their concentration of the same dopant;

the formation of the porous layer comprises oxidation, preferably thermal, of the material of the porous layer (and thus of the semi-insulating material resulting from the porosification of the original semiconductor material).

It is specified that the term "on" or "above" does not necessarily means "in contact with." Thus, for example, the deposition of one layer on another layer, does not necessarily mean that the two layers are directly in contact with one another, but this means that one of the layers at least partially covers the other while being either directly in contact with it, or by being separated from it by a film, yet another layer or another element. Moreover, a layer can consist of a plurality of undercoats of the same material or of different materials.

It is specified that the thickness of a layer or of a substrate is measured in a direction perpendicular to the surface along which this layer or this substrate has its maximum extension. Its width extends transversely to this thickness.

The use of the singular for certain elements does not necessarily mean that a given element is present only once. The word "one" does not therefore exclusively means "a single" unless otherwise specified.

Certain parts of the device can have an electric function. Certain ones are used for properties of electric conduction and electrode or the equivalent means elements formed from at least one material having sufficient conductivity, in the use, to carry out the desired function. Other parts, on the contrary, are used for properties of electric insulation and this concerns any material, which is in particular called dielectric, having sufficient resistivity to carry out this insulation.

Figure 1:
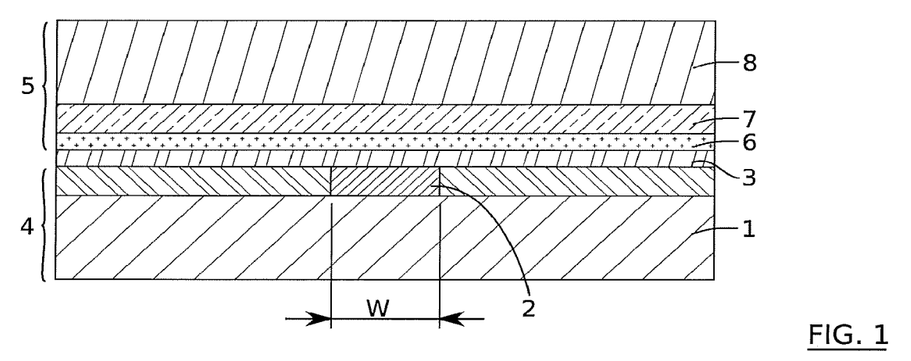
FIG. 1 illustrates a stack intended to manufacture a memory device according to the prior art.

FIG. 1 illustrates a conventional stack of layers intended to form a memory device. A layer of oxide 3 preferably of metal oxide (HfO2 for example), which will be the location of the formation of a conductive filament, is surrounded by a first electrode 4 by one of its faces and by a second electrode 5 by the other of its faces. For example, the first electrode 4 can comprise a layer for creating contact 1 allowing electrical connection from outside of this electrode and a portion 2 in contact with the layer of oxide 3. This portion is typically a portion of a layer deposited on the layer 1. This portion defines a width W determining the location of the passage of the current and thus the path defining the conductive filament through the layer of oxide 3. On the other side of the layer of oxide 3, a second electrode 5 is located above the underlying layers described above and can comprise a stack of layers made from electrically conductive materials. In the case illustrated, a first layer 6 and a second layer 7 are successively deposited on the layer of oxide 3 and covered with a contact layer 8. The layers 1 and 8 allow the electrical connection of the electrodes from the outside for the control of the memory device.

The memory device can be carried by a support, for example containing a substrate, in particular semiconductor substrate A plurality of devices is generally made on this support.

In the initial state, the active material is insulating (in a state called PRS, "Pristine Resistance State"). Active material means the material in which a phase of forming and then conductive or non-conductive states are produced as explained below. A first electric stress is applied to the virgin resistive memory in order to generate, for the first time, a low-resistance conductive state LRS (from "Low Resistance State"). The associated process is called FORMING. The resistive memory can then switch from the low-resistance conductive state LRS to a high-resistance conductive state HRS (from "High Resistance State") via the application of a first stress VRESET between the first and second electrodes, and switch back from the high-resistance conductive state HRS to the low-resistance conductive state LRS via the application of a second voltage VSET between the first and second electrodes. It can thus be used to store a piece of binary information. The low-resistance conductive state LRS is also called "ON" state. The high-resistance conductive state HRS is also called "OFF" state.

The phenomenon of change in the resistance is observed in various types of materials, which suggests different operating mechanisms. A plurality of type of resistive memories can thus be distinguished. The field in question is more particularly that of two categories of resistive memories:
 the memories comprising an active zone based on an active material containing oxide (OxRRAM memory or "Oxide RRAM") such as a binary oxide of a transition metal;
 the memories comprising an active zone based on an ionic-conduction material (CBRAM memories or "Conductive Bridging RAM") forming an ionic-conduction solid electrolyte positioned between an electrode forming an inert cathode and an electrode comprising an ionisable portion of metal, that is to say, a portion of metal than can easily form metal ions, and forming an anode.

The change in resistive state in an OxRRAM resistive memory is generally explained by the formation of a filament of gaps in oxygen in the active zone. The change in resistive state in a CBRAM resistive memory is generally explained by the formation of a conductive filament in the active zone.

The examples given below relate to OXRAM metal-oxide memories.

In the case of FIG. 1, it is the dimension W that affects the location of the FORMING step explained above.

An example of manufacturing a memory device will now be given.

Figure 2:
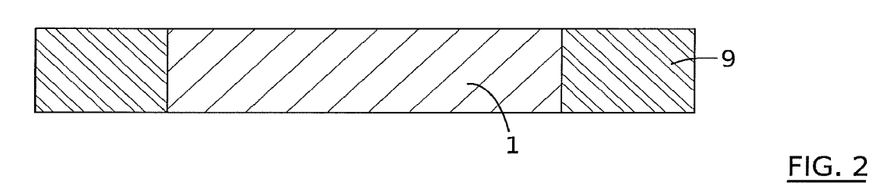
FIGS. 2 to 5 show possible steps of a beginning of a manufacturing method.

Preferably, the manufacturing starts with a substrate that has, in its surface layer, a contact layer 1 made of an electrically conductive material advantageously surrounded by electrically insulating portions 9 as shown in FIG. 2. Silicon dioxide can in particular be used. The conductive portion corresponding to the base layer 1 can in particular be aluminium, W, TiN or other metal alloys. Preferably, it forms a lower portion of the first electrode 27 of the device.

Figure 3:
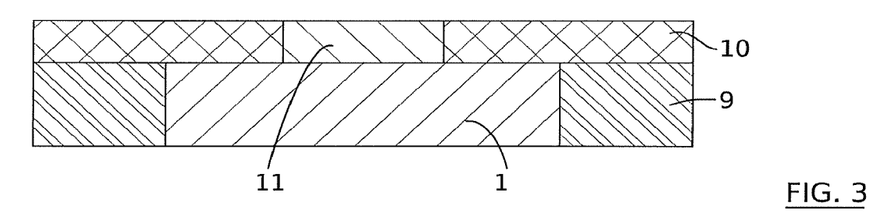

Above the base layer 1, in the case of FIG. 3, an upper level is created with an intermediate portion 11 of the electrode 27 (see FIG. 13) that can for example be in the form of a contact, and in particular made from tungsten. Preferably, the width dimension of the portion 11 is less than the width dimension of the layer 1. The portion 11 is surrounded by an electrically insulating material, for example a nitride or an oxide, such as $SiO_2$.

Figure 4:
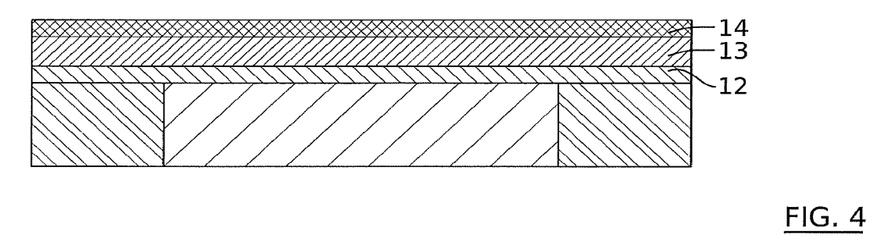

FIG. 4 shows the later deposition of one or more layers of electrodes 12, 13. Conventional deposition techniques such as chemical vapour deposition (CVD) or physical vapour deposition (PVD) that can be carried out on the whole plate can be used. The implementation of these steps is not bound by any particular manufacturing constraints, in particular in terms of uniformity of deposition. Moreover, all types of electrically conductive material can be used, for example Ti and TiN. In the case shown, the layer 12 can be titanium and the layer 13 titanium nitride.

Then, a preparation layer 14 of a semiconductor material, preferably silicon, is formed. The latter is also preferably deposited on the whole plate. According to one embodiment, the silicon used is doped. A p dopant or an n dopant can be used; a p+ (or n+) dopant allows the vertical development of the pores along the thickness of the layer of silicon to be promoted. The concentration of dopant is not limiting to the invention. For example, the thickness of the preparation layer 14 can be less than or equal to 100 nm (1 nm=$10^{-9}$ m).

Figure 5:
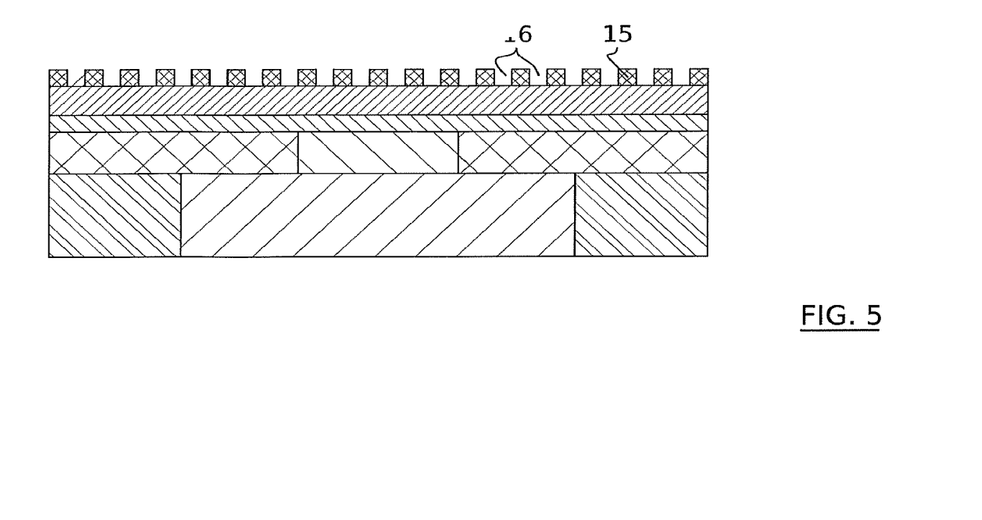

FIG. 5 is a diagram of the porosification of the preparation layer 14 in order to arrive at a porous layer 15. The pores are shown by the hollows formed in the layer 15. The porous layer is potentially less conductive than the starting material of the layer 14 (which is in the present example a semiconductor), and thus it can be considered a semi-insulant. It is further preferably more conducive than an insulating material. For example, the semi-insulating material can have an electric resistivity of more than $10^0$ Ωcm and of less than $10^6$ Ωcm and preferably of less than $10^4$ Ωcm.

At this stage, there is a porous layer offering a differential in electric conductivity between the porous material itself and the pores (that is to say, the vacuum or the air in the pores, or a material for filling these pores).

According to a first approach, particularly suitable for a functional porous layer in an electrode, here the first electrode 27, it is set up that the differential is created while favouring conduction by the pores.

This configuration corresponds to the case of FIGS. 6 to 15. Another embodiment will then be described in reference to FIGS. 16 to 19. Manufacturing steps can be similar in both cases and here, it must be considered that that which is described in one of the cases applies, mutatis mutandis, to the other case, in particular for the manufacturing of the porous layer.

The porous silicon (or another porous material) can be obtained by electrochemical oxidation (or anodisation) of the layer 14 of silicon deposited. An example of an embodiment is given below. This electrochemical method is thus carried out in a hydrofluoric acid medium. The characteristics of the porous layer (porosity, size of the pores, thickness . . . ) is dependent on the concentration of hydrofluoric acid (hereinafter HF), the density of the current the type and the level of doping of the silicon layer. The thickness of the layer of porous Si is determined by the duration of the anodisation. For this anodisation, the portion of the first electrode 27 already formed can be used as an anodisation electrode; applying a potential to this portion can be carried out via the rear of the device, at the rear face of the contact layer 1 or via the edge of the device, at one of the layers 12, 13 underlying the layer of semiconductor material (typically the layer of silicon) to be porosified.

Whether Si or another original material is involved, it can be porosified in such a way as to preserve the nature thereof but while creating pores. Also, via oxidation in particular, at least a portion of the thickness of the original material can be transformed in such a way as to obtain a transformed material that is part of (or forms) the porous layer. A porous layer at least partly of silicon oxide or at least partly of silicon can be obtained from an original layer of silicon. The original layer can be p- or n-doped.

In our case, a plurality of alternatives can be provided according to the type and the level of doping of the layer of silicon deposited.

Alternative 1: p layer of silicon uniformly doped with doping of less than $10^{17}$ cm$^{-3}$ (p).

For a mass concentration of HF of 20% and a current density of 20 mA/cm$^2$, the speed of formation of the porous layer is 7 nm/s. The desired thickness is obtained by adjusting the anodisation time. For example, for a deposited layer 14 of Si having a thickness of 100 nm, anodisation of 14 seconds leads to a porous layer of 98 nm and leaves a layer of bulk Si of 2 nm.

Alternative 2: p+ layer of silicon uniformly doped with doping of more than $10^{17}$ cm$^{-3}$.

For a mass concentration of HF of 20% and a current density of 50 mA/cm2, the speed of formation of the porous layer is 45 nm/s. The desired thickness is obtained by adjusting the anodisation time. For example, for a deposited layer 14 of Si of 100 nm, anodisation of 2.18 seconds leads to a porous layer of 98 nm and leaves a layer of bulk Si of 2 nm.

For these two alternatives, the thickness is obtained by adjusting the time.

The measurement of the potential can also be used during the anodisation with constant current to control the thickness as described in alternative 3 below:

Alternative 3: in this case, instead of using a layer of Si uniformly doped (p or p+ like in the case of alternatives 1 and 2), two layers of Si having different doping are successively deposited. This results in a superposition of two layers of semiconductor materials (the semiconductor material to be porosified and an underlying layer of a second semiconductor material) of the same type, typically silicon, but with different doping either in terms of the nature of the dopant (p or n) or in terms of the concentration (for example p/p+ or n/n+). The order of deposition of these different materials is not very important.

During the anodisation, the passage from one layer to another manifests itself as a sudden variation in potential. This sudden variation is used as a detection of the end of attack. For example, a fine layer of p+ doped Si (2 nm for example) is deposited, followed by a thicker layer of p-doped Si (98 nm for example). When the potential suddenly changes, the anodisation method is stopped and a porous layer 98 nm thick on an underlying layer of Si 2 nm thick is obtained.

In these notations, p and n correspond to concentration of dopant less than $10^{17}$ cm$^{-3}$ and p+ and n+ to a concentration of dopant greater than $10^{17}$ cm$^{-3}$.

It is understood from the examples given above that the step of porosification can be carried out until the last layer of electrode 13 precedingly deposited is reached; the material of the latter is thus advantageously chosen to be used as a barrier layer. Nevertheless, an underlying layer of semiconductor material different than the material to be porosified can also be used as a barrier layer in alternative 3 above. It is also possible to modify the parameters of the anodisation in order to stop the porosification according to the thickness of the layer of semiconductor material in such a way as to leave, in the initial layer 14, a fine base portion, for example having a thickness of less than 5 nm and preferably equal to 2 nm. This residual portion of non-porosified material can thus form a portion of the first electrode 27, below the porous layer.

In the case of FIGS. 6 to 15, the portion of the first electrode 27 located under the layer 15 is called base portion of the electrode 27. The portion of the electrode 27 formed by the layer 15 and the filling material is the upper portion, or surface portion, of the electrode; it is the one proximal to the active portion.

Figure 6:
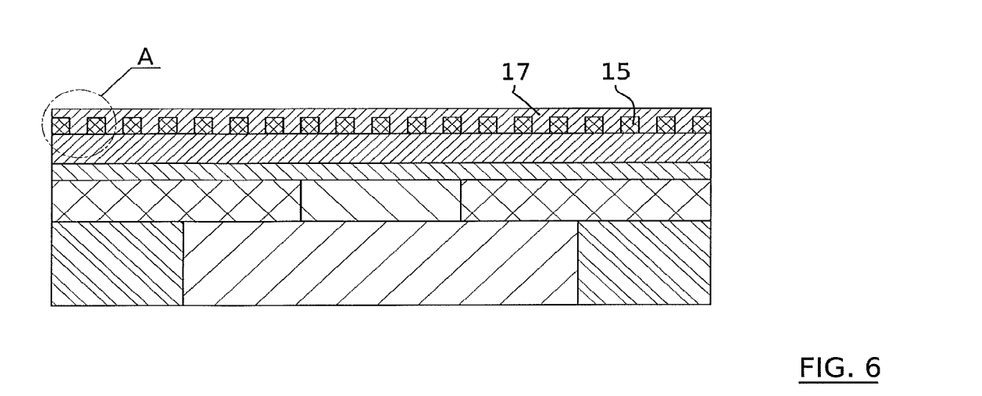
FIGS. 6 to 15 show successive steps indicative of an embodiment.
Figure 7:
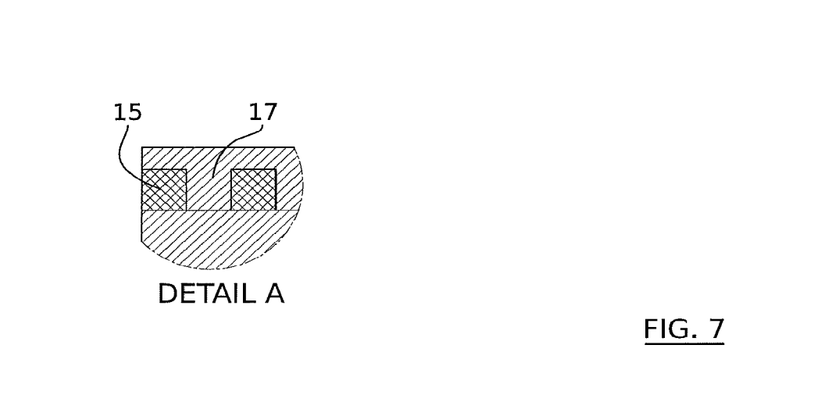

The layer 15 thus provided with a plurality of pores is the object of a step of filling of the pores with an electrically conductive material 17. This material is preferably selected in such a way that its electric conductibility is greater than or equal to that of the material of the layer 15. The latter is, after the porosification, a semi-insulating material (its resistivity is greater than that of a metal). This can be for example titanium nitride. Preferably, the latter material can be deposited via atomic layer deposition (ALD) or chemical vapour deposition (CVD), preferably over the entirety of the surface of the layer 15 and in such a way as to at least partly fill in the pores. Thus, the configuration illustrated in FIG. 6 is obtained. In general, the electrically conductive filling material 17 also forms a layer on the surface of the layer 15. The thickness of the material 17 deposited can be between 2 nm and 100 nm and is advantageously at least equal to the thickness of the porous layer 15. FIG. 7 shown a detail of FIG. 6 illustrating the example of complete filling of the pores with the material 17. It can, however, suffice to create a covering on the wall of the pores without completely filling the inner volume. The filling is at minimum configured to establish the electric continuity through the pores.

Figure 8:
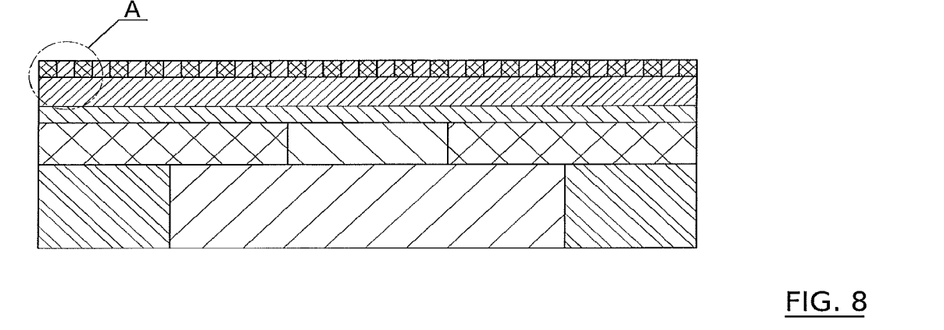
Figure 9:
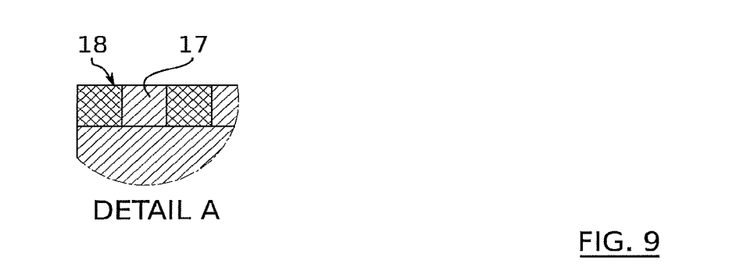
Figure 10:
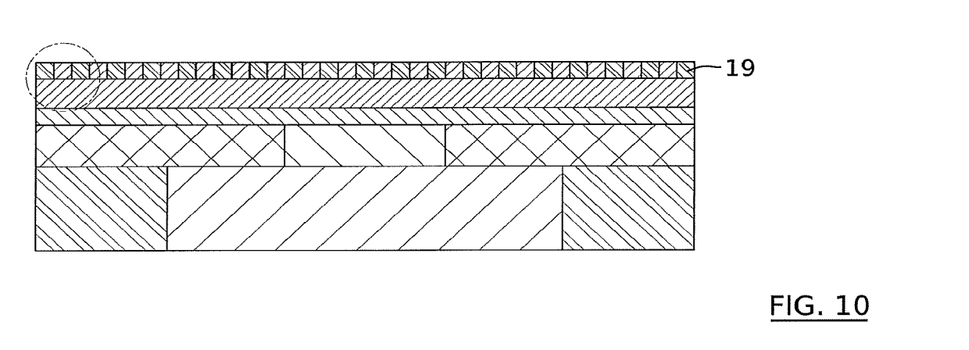
Figure 11:
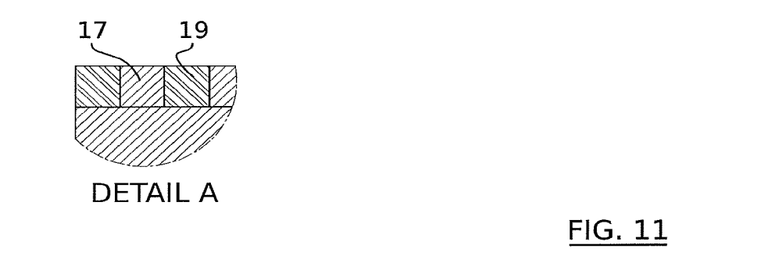

Then, it is desired to eliminate the surface portion of the material 17 in such a way as to reform a porous layer 15 flush with the surface of the stack thus formed. For this purpose, planarisation can be carried out, for example via techniques of chemical and/or mechanical polishing. The result of this step is illustrated in FIGS. 8 and 9.

Optionally, the electric conductivity of the porous layer 15 can be reduced in such a way as to increase its contrast in conductivity with the material 17 used to fill the pores. For example, oxidation of the semi-insulating material forming the porous layer 15 is carried out. In the case of silicon, thermal oxidation at a temperature for example of approximately 300° C. under a flow of dioxygen can be suitable. The result of this step is provided in FIGS. 10 and 11 with an oxidised porous layer 19. This step is, however, optional.

In general, it is understood that the pores filled with the material 17 form zones having an almost point-shaped cross-section of conductivity tracks through an upper portion of the first electrode 27.

The layer 15 or the oxidised layer 19, the pores of which are at least partially filled with the material 17, can then be made to cooperate with the active layer that can change of conductive state, which can be a layer of oxide 20 in which the conductive filament is formed. The forming of this filament occurs via the electric conduction through one of the filled pores.

Figure 12:
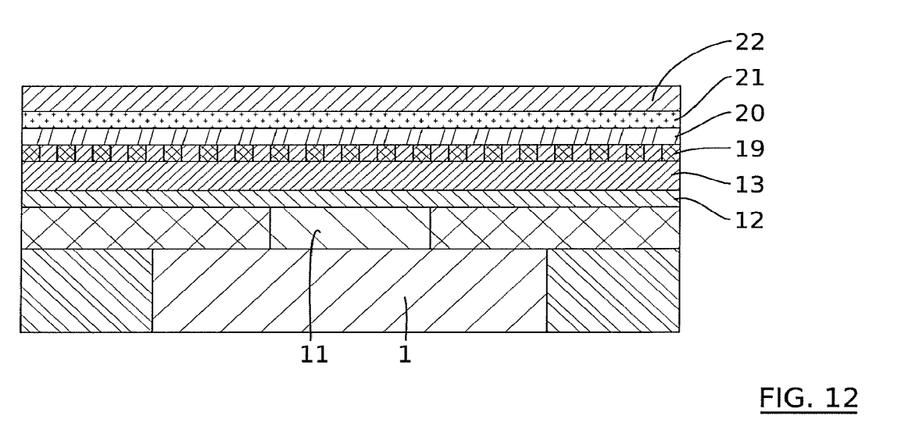

Thus, in FIG. 12, the layer of oxide 20 has been deposited above the oxidised porous layer 19 precedingly obtained (or above the porous layer 15 if the oxidation has not been implemented). The oxide can also be inserted into the pores, if the latter have not been completely filled with the conductive material 17. At minimum, there is a contact, above and/or in a pore between the conductive material 17 and the layer of oxide, in order to establish the electric conduction that generates the filament. It is then possible to form layers intended to be superimposed in such a way as to produce the second electrode 28 of the memory device. It is the creation of these deposits that is also shown in FIG. 12.

For all or a portion of these deposits, it can be advantageous to implement techniques allowing good uniformity like the deposition of atomic layers ALD (for "Atomic Layer Deposition") or the chemical vapour deposition CVD (for "Chemical Vapor Deposition"). Like above, the manufacturing proposed can be implemented via various techniques and with few constraints. Namely, this can once again involve deposits on the whole plate.

The layer 20 is preferably a metal oxide such as HfO2. The layers 21, 22 that are part of the electrode 28 can comprise any conductive material such as titanium (Ti) and titanium nitride (TiN), and these materials can be used for the layers 21 and 22, respectively.

Figure 13:
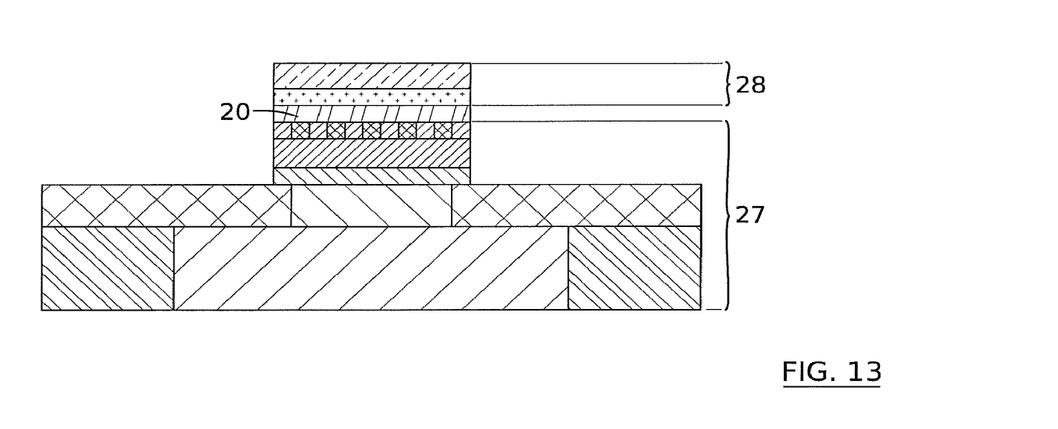

The final pattern of the memory device appearing in FIG. 13 can thus be made, while reducing the width of the memory point overhanging the intermediate portion 11 in the illustrated case. The width of this pattern can be equivalent to or greater than that of the portion 11 that is for example a contact point.

For this purpose, the etching of the second electrode 28 and of the layer 20, then that of the layer of porous material, then that of the layers 13 and 12 above the intermediate portion 11 allowing the contact to be created in cooperation with the layer 1 can be carried out successively. Dry etching techniques such as RIE (from "Reactive-Ion Etching"), ionic machining or a mixture of the two above techniques can be used.

Figure 14:
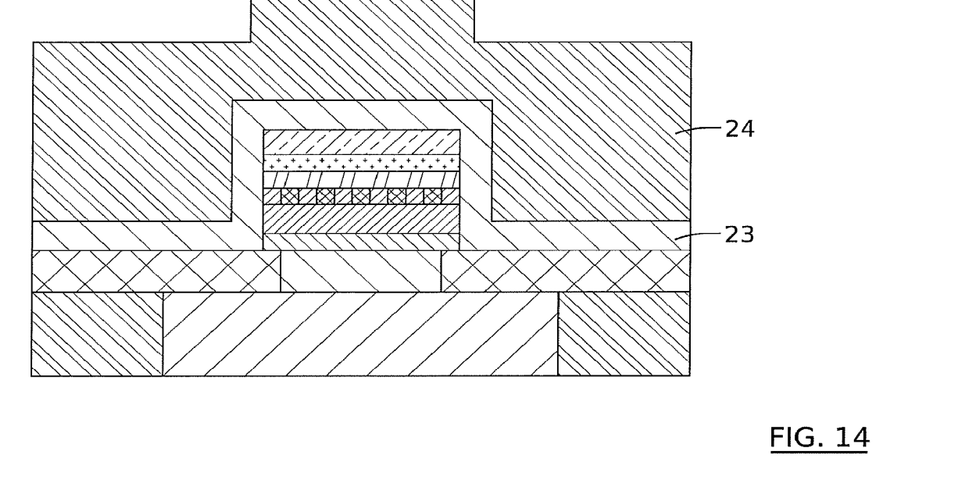

The finalisation of the memory device can involve encapsulation with at least one encapsulation layer and in particular with an encapsulation layer 23 and an insulating layer 24. The layer 23 is in particular used to protect the memory point from oxidation and can be made of SiN. The layer 24 can be made of $SiO_2$. The memory point is thus insulated from its environment as shown in FIG. 14.

Preferably, the surface of this encapsulation portion is subject to planarisation before the creation of a contact on the second electrode 28 as follows.

Figure 15:
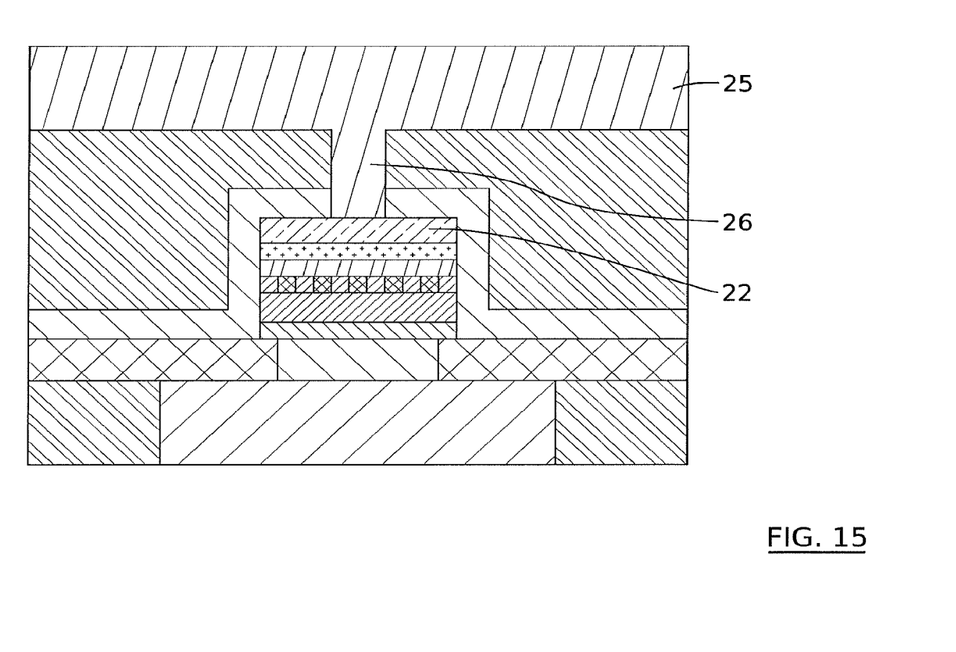

An opening made from the outer face of the encapsulation layers 24 and 23 allows the contact for the second electrode 28 to be created, via a contact layer 25 in the electric continuity of a via 26 made through the encapsulation layer(s) 23, 24. The via is applied onto an upper face of the conductive stack formed by the layers of electrodes 21, 22 of the upper electrode 28.

In the embodiment illustrated, it is the first electrode 27, located at the bottom of the stack (and thus typically the lower electrode) that receives the porous layer that is subject to filling with an electrically conductive material. This case is an example and it is not excluded that it be the upper electrode (in the given example: the second electrode 28) that is subject to this treatment, or even both electrodes.

In the configurations in which the upper electrode comprises a porous layer, the method can for example comprise the following steps: the oxide is deposited, then one or more conductive layers (which are for example Ti, in particular 10 nm thick and TiN—that is to say the layers that act as an upper electrode) are deposited; then the porous silicon (or other suitable material) is made, which is filled for example with TiN.

In the example of FIGS. 16 to 19, the porous layer 15 is used in the context of the active portion that can change of conductive state.

Going back to FIG. 5, which can be a starting point for the manufacture of the memory device according to this embodiment, the porous layer 15 is exposed to the upper surface of a stack that comprises layers of the first electrode 27. Nevertheless, on this basis, this time it is not desired to produce electric conduction through pores towards the active layer, but to form a portion of the latter.

Figure 16:
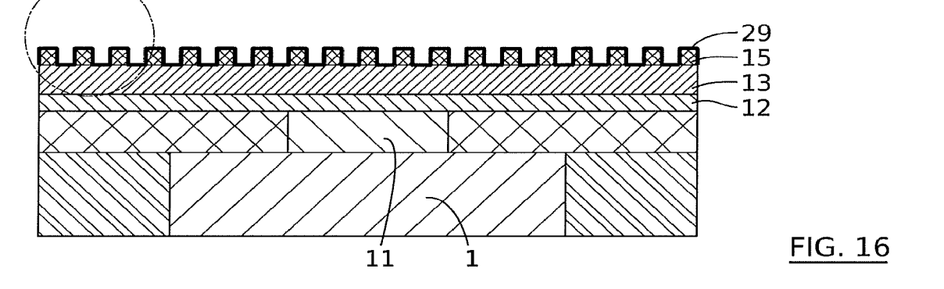
FIGS. 16 to 19 show another embodiment.

In the example given in FIG. 16, which is not limiting, an insulating layer 29 is created on the porous layer 15. Preferably, it is oxidation of the porous layer 15 that forms this second layer 29. The oxidation phase is configured in such a way that it is only partial, for example at most 20% of the thickness of the porous layer 15. The oxidation can be carried out via a thermal process at a temperature preferably less than or equal to 300° C. and/or a duration less than or equal to 1 hour. For example, the layer of oxide can have a thickness of less than 10 nm.

Figure 17:
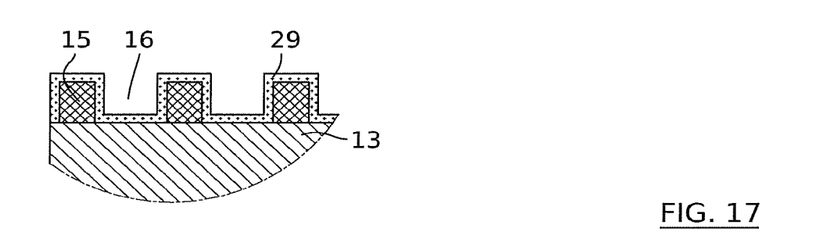

This oxidation coats the wall of the pores in such a way as to electrically insulate the porous material and trap it in an insulating layer. The material used as a base for the porous layer 15 is also advantageously oxidised at the bottom of the pores. If this is a residual portion of the layer 14 used for the porosification, a layer of oxide of the same material is obtained on the porous layer and on the layer underlying said layer. This is illustrated in FIG. 17 which gives a detail of FIG. 16. Forming the insulating layer via another means, via deposition of an insulating material for example, is not excluded.

The layer 29 ensures lateral insulation of the material of the porous layer and generates more directionality of the electric circulation in the thickness dimension. Moreover, the electric resistivity is thus increased in contact with the second electrode 28. The formation of the layer 29 is not, however, required.

According to a non-illustrated case, the pores can be filled at least partly with a material that is preferably dielectric. The conducive filament of the memory can, in this case, be made either in the latter material or in the material that was porosified, in particular in that which is the most electrically resistive. More simply, the pores can be not filled and left exposed to the air or filled with another gas or under vacuum.

Preferably, it is the material of the porous layer that is used as an active layer. In particular, this layer can, after porosification, have filaments through its thickness, and these filaments can act as paths for varying conduction. Preferably, the porosification at least partly preserves the original material of this layer. In the case of a porous layer made of silicon, the porosification and then the optional oxidation from which the layer 29 is produced preserve, despite everything, advantageously underlying silicon that is used as a layer that changes conductive state.

Figure 18:
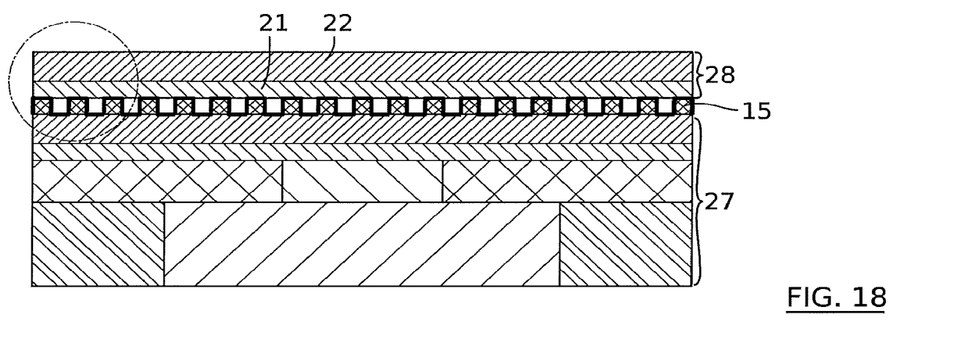
Figure 19:
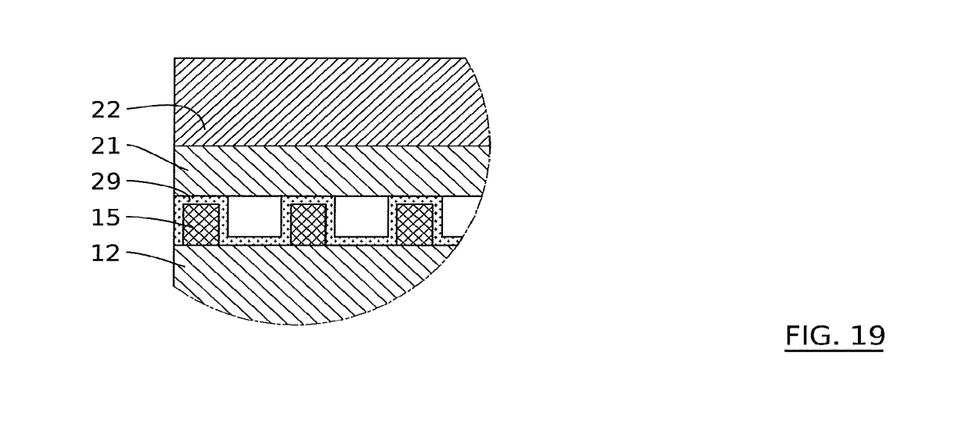

FIG. 18 then shows the creation of the second electrode 28. The latter can in particular comprise a stack of layers 21, 22 as described above, with for example the same choices of materials. This can include steps of depositing above the optionally-covered porous layer of the layer 29. However, it is desirable that these deposits do not fill (or at least not along the entire thickness) the pores 16. Surface deposits are thus preferred, in particular deposition via PVD. Moreover, it is desirable that the pores have, in this case, a small size, in particular of less than 10 nm. Thus, the second electrode 28 is above the porous layer 15 without being introduced into its pores 16, as shown in FIG. 19.

In such a configuration, the second electrode 28 thus only contacts the active portion that can change of conductive state by zones having small dimensions.

The device can then be finalised as is visible in FIGS. 13 to 15 in the above example, with lateral shaping via etching, and encapsulation.

It should be noted that the manufacturing is implemented in the preceding examples via conventional techniques without any particular constraints in particular with regard to the dimensions of the contacts, while having a definition of the point of formation of the conductive filament having high resolution (having a very small size). Sizes of zones of formation of the conductive filament can be for example less than 50 nm, or even less than 5 nm, without sets of manufacturing problems like those encountered in the case of etching and lithography. Despite the small potential dimensions, the contact is not affected. During operation, the memory device thus obtained can be more efficient than a conventional device having a mesa structure. This manufacturing can be integrated into the end-of-manufacturing portion called Back-end or well before called Front End (close to the transistors in particular).

REFERENCES

1. Contact layer
2. Dimensionally critical portion
3. Layer of oxide
4. First electrode
5. Second electrode
6. First layer
7. Second layer
8. Contact layer
9. Insulating portion
10. Insulating portion
11. Intermediate portion
12. Electrode layer
13. Electrode layer
14. Preparation layer
15. Porous layer
16. Pore
17. Conductive material
18. Upper face
19. Oxidised porous layer
20. Layer of oxide
21. Layer of electrode
22. Layer of electrode
23. Encapsulation layer
24. Insulating layer
25. Contact layer
26. Via
27. First electrode
28. Second electrode
29. Second layer of active portion
w. width

The invention claimed is:
1. A memory device, comprising:
a first electrode,
a second electrode and
an active portion for changing a conductive state,
wherein the active portion is positioned between a first face of the first electrode and a first face of the second electrode,
the first electrode comprises an upper portion forming the first face of the first electrode,
at least one of the upper portion and the active portion comprises a porous layer, and
the porous layer is obtained from p- or n-doped silicon.
2. The memory device according to claim 1,
wherein the porous layer is comprised in the upper portion,
the porous layer is in contact with the active portion, and
the porous layer is located on a base portion of the first electrode, at least one pore of the porous layer being at least partially filled with an electrically conductive material configured to establish electric continuity between the base portion of the first electrode and the active portion.
3. The memory device according to claim 2,
wherein the electrically conductive material completely fills at least one pore.
4. The memory device according to claim 2,
wherein the porous layer has an electrical resistivity greater than or equal to that of the electrically conductive material.
5. The memory device according to claim 2,
wherein the electrically conductive material is titanium nitride.
6. The memory device according to claim 2,
wherein the porous layer is made of silicon dioxide.
7. The memory device according to claim 6,
wherein the silicon dioxide is obtained via oxidation of the p- or n-doped silicon.

8. The memory device according to claim 1,
wherein the porous layer is comprised in the active portion and the porous layer is in contact with at least one of the first face of the first electrode and the first face of the second electrode.

9. The memory device according to claim 8,
wherein the pores of the porous layer are at least partly under vacuum, or filled with air or filled with a material that is more electrically insulating than a material of the porous layer and/or of a dielectric nature.

10. The memory device according to claim 8,
wherein the active portion comprises, between the porous layer and the second electrode, a second layer more electrically insulating than the porous layer.

11. The memory device according to claim 10,
wherein the second layer is made of an oxide of a material of the porous layer.

12. The memory device according to claim 8,
wherein a material of the porous layer forms a material for changing a conductive state.

13. The memory device according to claim 1,
wherein the porous layer is a semi-insulating material.

14. The memory device according to claim 1,
wherein a size of pores of the porous layer is less than 10 nm.

15. The memory device according to claim 1,
wherein a thickness dimension of the porous layer is less than 100 nm.

16. The memory device according to claim 1,
wherein a size of pores of the porous layer is greater than or equal to 2 nm.

17. A method for manufacturing the memory device of claim 1, the method comprising:
(i) forming the first electrode;
(ii) forming the active portion, which has a face in contact with the first face of the first electrode; and
(iii) forming the second electrode in contact with another face of the active portion, wherein the porous layer is formed in at least one of the upper portion and the active portion.

18. The method according to claim 17,
wherein the forming (i) comprises (i-i) forming an upper portion, which forms the first face of the first electrode, the forming (i-i) comprising:
forming the porous layer, which is in contact with the active layer and located on a base portion of the first electrode; and
at least partial filling at least one pore of the porous layer with an electrically conductive material configured to establish electric continuity between the base portion of the first electrode and the active layer.

19. The method according to claim 18,
wherein the at least partial filling is configured to completely fill at least one pore.

20. The method according to claim 18,
wherein a material of the porous layer is chosen to be more electrically resistive than the electrically conductive material.

21. The method according to claim 18,
wherein the at least partial filling comprises depositing the electrically conducive material on the porous layer and then removing a portion of the electrically conductive material deposited on a surface of the porous layer.

22. The method according to claim 17,
wherein the forming (ii) comprises forming a porous layer in contact with the first electrode.

23. The method according to claim 22,
wherein a material of the porous layer forms a material for changing a conductive state.

24. The method according to claim 17,
wherein the forming the porous layer comprises depositing a layer of a first semiconductor material, and then porosificating the first semiconductor material.

25. The method according to claim 24,
wherein the porosificating is carried out via electrochemical anodisation by using a base portion of the first electrode as an electrode for the electrochemical anodisation.

26. The method according to claim 24,
wherein a surface of a base portion of the first electrode is used as a barrier layer for the porosificating.

27. The method according to claim 24,
wherein the porosificating is stopped before it reaches a base portion of the first electrode, in order to preserve a layer of a non-porous semiconductor material under the porous layer.

28. The method according to claim 24,
wherein before the depositing the layer of the first semiconductor material, an underlying layer of a second semiconductor material different from the first semiconductor material, is deposited,
the depositing the layer of the first semiconductor material is carried out in contact with the underlying layer, and
a variation in electric potential is detected during an electrochemical anodisation corresponding to an end of oxidation of a thickness of the layer of the first semiconductor material and to a beginning of oxidation of the underlying layer, and the electrochemical anodisation is stopped upon detection of the variation in the electric potential.

29. The method according to claim 28,
wherein the first semiconductor material and the second semiconductor material are silicons having doping that differs by a type of dopant (p, n) or by a concentration of the same dopant.

30. The method according to claim 17, further comprising thermal oxidation of at least a portion of a material of the porous layer.

* * * * *